United States Patent

Attey

[11] Patent Number: 5,822,993
[45] Date of Patent: Oct. 20, 1998

[54] COOLING APPARATUS

[75] Inventor: Graeme Scott Attey, South Fremantle, Australia

[73] Assignee: Hydrocool Pty Limited, Fremantle, Australia

[21] Appl. No.: 737,125

[22] PCT Filed: May 12, 1995

[86] PCT No.: PCT/AU95/00271

§ 371 Date: Nov. 13, 1996

§ 102(e) Date: Nov. 13, 1996

[87] PCT Pub. No.: WO95/31688

PCT Pub. Date: Nov. 23, 1995

[30] Foreign Application Priority Data

May 13, 1994 [AU] Australia ............................. PM 5596
Aug. 8, 1994 [AU] Australia ............................. PM 7288

[51] Int. Cl.[6] .................................................. F25B 21/02
[52] U.S. Cl. ....................... 62/3.7; 62/3.2; 165/109.1; 165/DIG. 320
[58] Field of Search ......................... 62/3.2, 3.3, 3.7; 165/109.1, DIG. 320, 121; 366/149

[56] References Cited

U.S. PATENT DOCUMENTS

| 3,212,274 | 10/1965 | Eidus ........................................... 62/3.7 |
| 3,559,437 | 2/1971 | Panas . |
| 4,829,771 | 5/1989 | Koslow et al. . |
| 5,314,586 | 5/1994 | Chen ........................................... 62/3.7 |

*Primary Examiner*—John M. Sollecito
*Attorney, Agent, or Firm*—Bliss McGlynn, P.C.

[57] ABSTRACT

A thermoelectric system (10) having a thermoelectric module (12) having first and second opposed outer faces, that first outer face being relatively cool and the second outer face being relatively hot in use, a manifold (22) defining a volume being attached to at least one outer facts of the thermoelectric module (12), the manifold (22) having a liquid inlet (30) and a liquid outlet (32) so that, in use, liquid flows through the manifold (22) wherein the manifold (22) contains a non-static means such as an impeller (40) for increasing turbulence in the liquid flowing therethrough so as to increase efficiency of heat transfer between the thermoelectric module (12) and the liquid.

10 Claims, 2 Drawing Sheets

COOLING APPARATUS

DESCRIPTION

The present invention relates to a cooling apparatus. In particular, the present invention relates to a thermoelectric cooling apparatus.

FIELD OF THE INVENTION

It is known to use thermoelectric modules in cooling systems. A thermoelectric module is a known type of heat pump in which the passage of an electric current through the module causes one side of the module to be cooled and the opposite side of the module to be heated.

Thermoelectric modules are also known as Peltier cells or thermoelectric heat pumps. In International Patent Application No. PCT/AU92/00008 in the names of Hyco Pty Ltd and Poseidon Scientific Instruments Pty Ltd there is described and claimed a thermoelectric system comprising a thermoelectric heat pump having first and second opposed outer faces and a manifold defining a volume attached to at least one outer face of the thermoelectric heat pump. The or each manifold has a fluid inlet and a fluid outlet so that fluid flows through to the or each manifold.

The inlet and the outlet are connected to heat exchange means and fluid pump means is provided for circulating fluid between the or each manifold and the heat exchange means. The thermoelectric system of International Patent Application No. PCT/AU92/00008 is primarily intended for cooling applications such as refrigeration or air conditioning. In International Patent Application No. PCT/AU94/00039 there is described a thermoelectric cooling system with a novel type of manifold. This manifold has arrangements for increasing the velocity and/or turbulence of fluid flowing through the manifold such as spiral members or protuberances.

International Patent Application Nos. PCT/AU92/00008 and PCT/AU94/00039 both describe inter alia manifolds mounted to each face of the thermoelectric module. The manifolds feature small torturous paths for fluid to flow between the inlet and outlet tubes.

The entire disclosures of International Patent Application Nos. PCT/AU92/00008 and PCT/AU94/00039 are incorporated herein by reference.

SUMMARY OF THE INVENTION

It has now been discovered that the heat transfer between a thermoelectric module face and a cooling system can further be enhanced by the use of a manifold containing non-static means for increasing liquid turbulence.

In accordance with one aspect of the present invention there is provided a thermoelectric system characterised by a thermoelectric module heat pump having first and second opposed outer faces, the first outer face being relatively cool and the second outer face being relatively hot in use, a manifold defining a volume being attached to at least one outer face of the thermoelectric module, the manifold having a liquid inlet and a liquid outlet so that, in use, liquid flows through the manifold, wherein the manifold contains a non-static means for increasing turbulence in the liquid flowing therethrough so as to increase efficiency of heat transfer between the thermoelectric module and the liquid.

In accordance with another aspect of the present invention there is provided a thermoelectric module characterised by having electrically insulating heat conductive plates as its outer faces, the plates having a peripheral gap between them and this gap being sealed.

BRIEF DESCRIPTION OF THE DRAWINGS

The present invention will now be described, by way of example, with reference to the accompanying drawings, in which.

DESCRIPTION OF THE INVENTION

Figure 1:
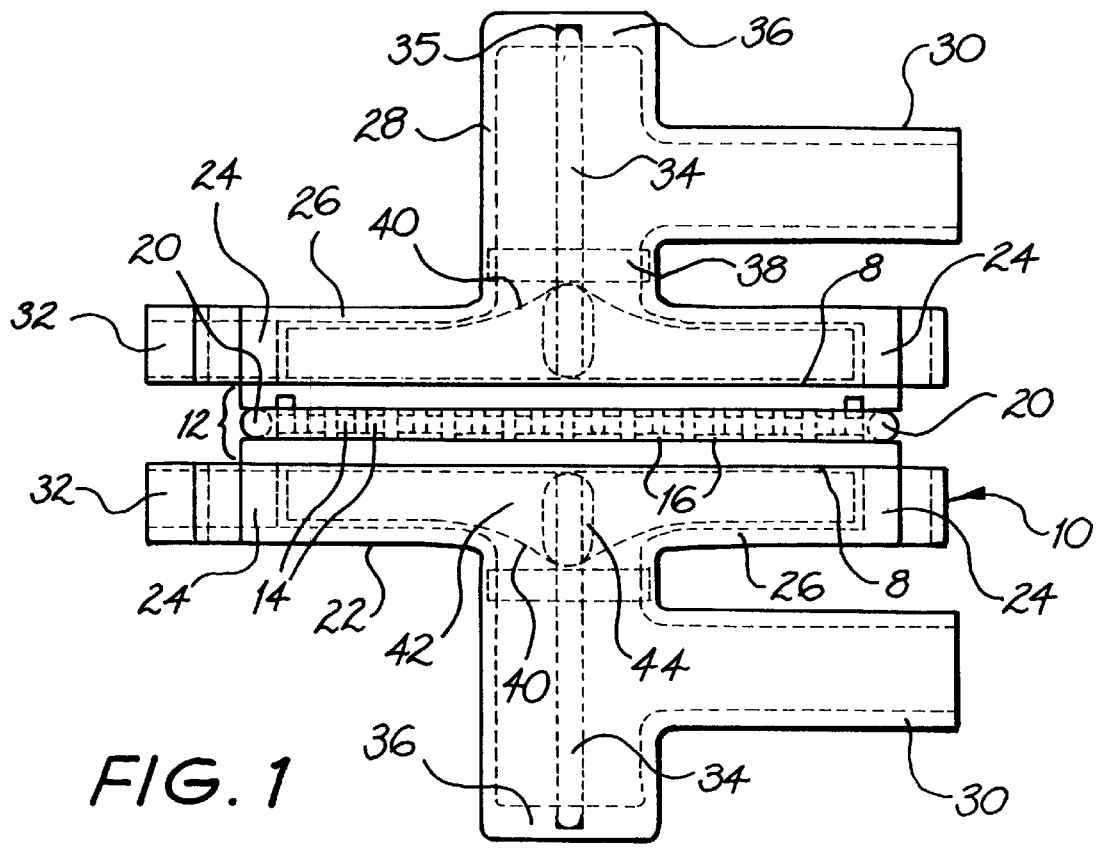
FIG. 1 is a side elevation of a thermoelectric system in accordance with the present invention.
Figure 2:
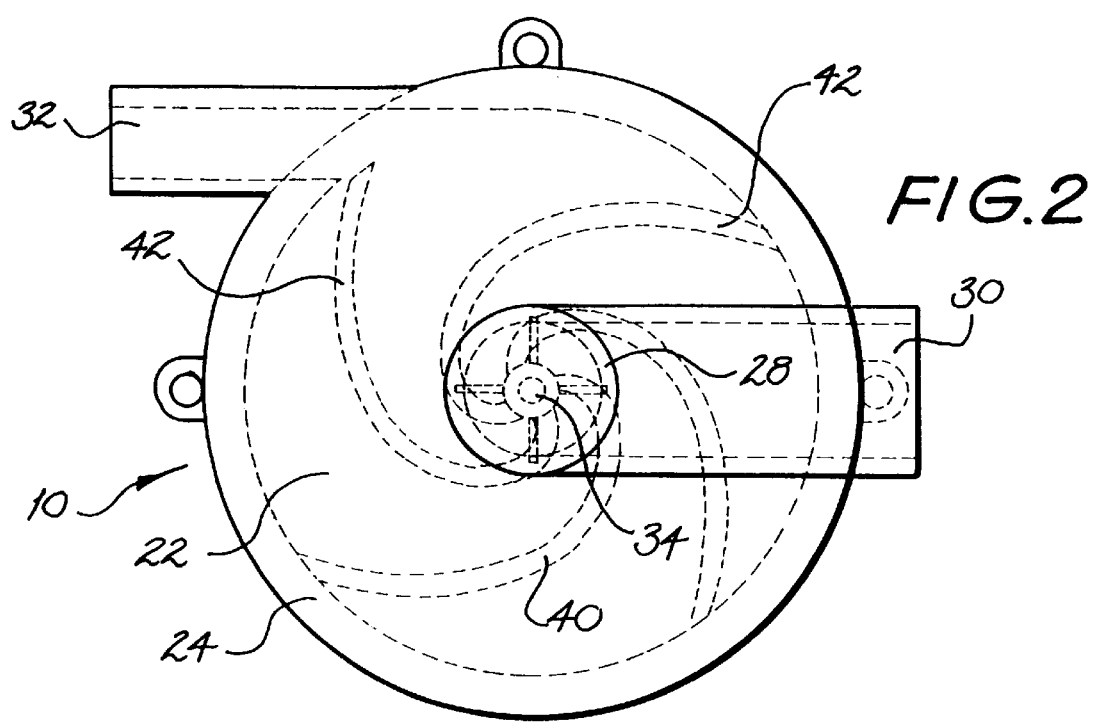
FIG. 2 is a plan view of the thermoelectric system of FIG. 1.

In FIGS. 1 and 2 of the accompanying drawings, there is shown a thermoelectric system 10 in accordance with the present invention comprising a thermoelectric module 12. The thermoelectric module 12 comprises an array of spaced P & N thermocouples 14 in known manner. As described in patent application Ser. Nos. PCT/AU92/00008 and PCT/AU94/00039 the thermocouples 14 are electrically connected together by electrically conductive connectors 16 so that there is an electrical flow path across the array.

Further, anodised aluminium plates 18 are mounted on each side of the thermocouple connectors 16. The anodised aluminium plates 18 have surfaces which have a relatively thick anodised coating of aluminium oxide which is electrically non-conductive. The anodised aluminium plates 18 may be from about 1 to 3 mm, such as about 2 mm thick but are found to have good thermal conductance characteristics.

Still further, as will be described in more detail hereinafter and as can be seen in FIG. 2, the thermoelectric module 12 is substantially circular in plan view. Further, a gap at the peripheries of the anodised aluminium plates 18 is sealed by an O-ring 20.

A respective open faced manifold 22 is mounted to each face of the thermoelectric module 12 so as to abut eternal faces 8 of the anodised aluminium plates 18. Each manifold 22 defines a volume and comprises a substantially circular sidewall 24 which extends around the periphery of one of the aluminium plates 18 and is adhered thereto by any suitable means in liquid tight manner. Each manifold 22 further comprises a rear wall 26 which is generally parallel to but spaced from the corresponding anodised aluminium plate 18. Each manifold 22 further comprises a hollow rearward projection 28 which extends rearwardly from the rear wall 26. Extending laterally from each projection 28 is a liquid inlet tube 30. Further, a liquid outlet tube 32 extends tangentially from each side wall 24 as can best be seen in FIG. 2

A shaft 34 is rotatably disposed in the projection 28 and extends into the manifold 22. The shaft 34 is rotatably supported in a recess 35 in a rearmost wall 36 of the projection 28 and a bearing 38 mounted in the projection 28.

An impeller 40 is mounted on each shaft 34 at the end thereof adjacent each anodised aluminium plate 18. The impeller 40 is an open faced impeller having a number of curved blades 42 extending outwardly from a hub 44 mounted on the shaft 34. There is no backing plate for the blades 42 as this would impede liquid flow onto the module face 8 in use.

Each shaft 34 may be rotated by means of a rotatably driven shaft (not shown) which extends sealingly through a wall of the projection 28 and connects with the shaft 34. Alternatively, the shaft may be driven magnetically by means of a rotatably driven external magnet (not shown) causing a magnet (not shown) on the shaft 34 to rotate.

In use, an electrical current is passed through the row of thermocouples 14 of the thermoelectric module 12 in known manner. This causes one side of the thermoelectric module 12 to become hot and the other side to become cold.

In order to transfer the heat to or from the thermoelectric module 12 liquid is passed into each inlet tube 30 whilst each impeller 40 is caused to rotate on its respective shaft 34 as described above. The incoming liquid is thus caused by the impeller blades 42 to swirl in a generally circular manner over the adjacent outer face 8 of the module 12. This induces a substantial degree of turbulence in the liquid which means that there is an efficient heat transfer between the module face 8 and the liquid. The liquid after passing through the impeller 40 then leaves the manifold 22 by the outlet tube 32.

The liquid from the outlet tube 32 then typically passes to a heat exchanger (not shown) in known manner and may then be subsequently returned to the manifold 22 for further heat transfer. The substantially circular shape of the thermoelectric module 12 ensures that the swirling liquid from the impeller 40 generally reaches all parts of the adjacent plate 18.

The advantages of a non-static manifold system in accordance with the present invention include the following:

the number of overall components in the system is reduced;

the fluid impedance of the system is reduced compared to prior art systems which results in higher flow rates and hence improved heat transfer from increased turbulence at the thermoelectric module face; and the small torturous fluid paths of the prior art are avoided which reduces the possibility of fluid path blockages in the systems.

Figure 3:
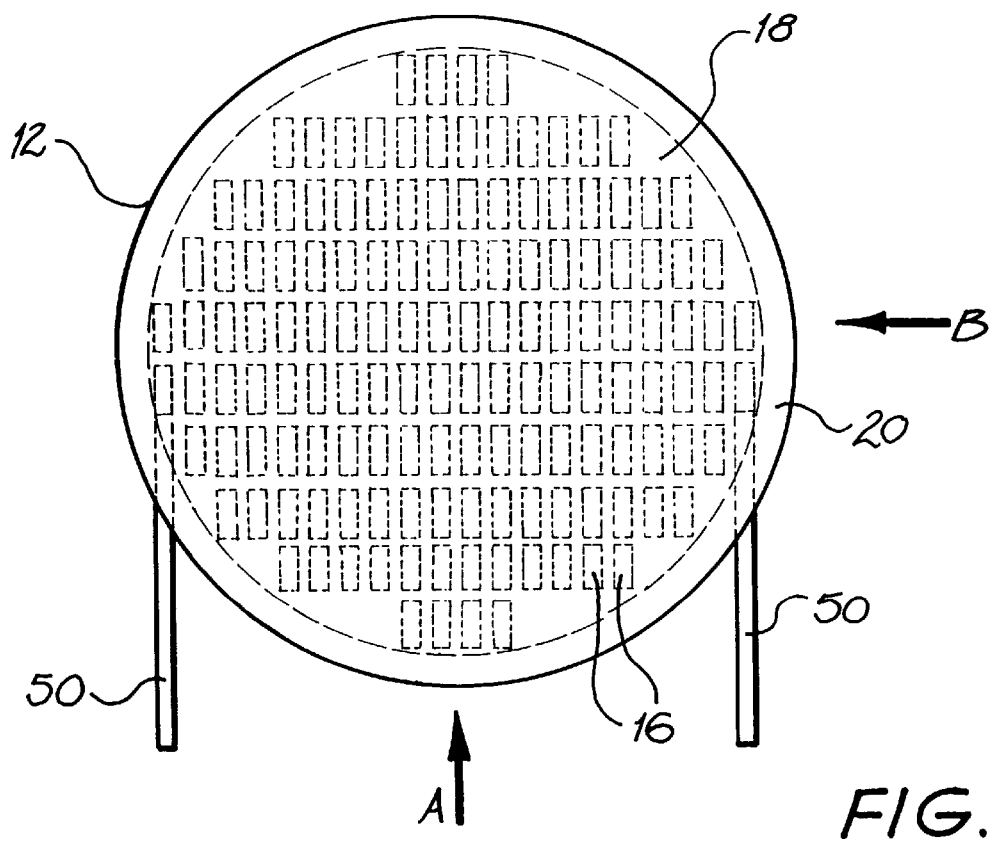
FIG. 3 is a plan view of a thermoelectric module in accordance with the present invention as used in the system of FIGS. 1 and 2.
Figure 4:
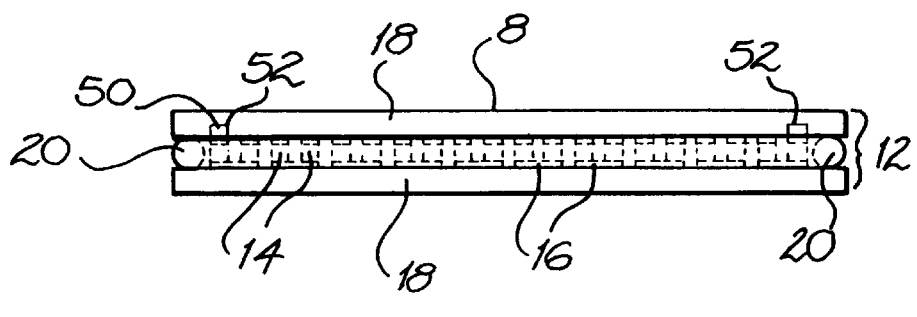
FIG. 4 is an end view looking from the direction of the arrow A in FIG. 3.
Figure 5:
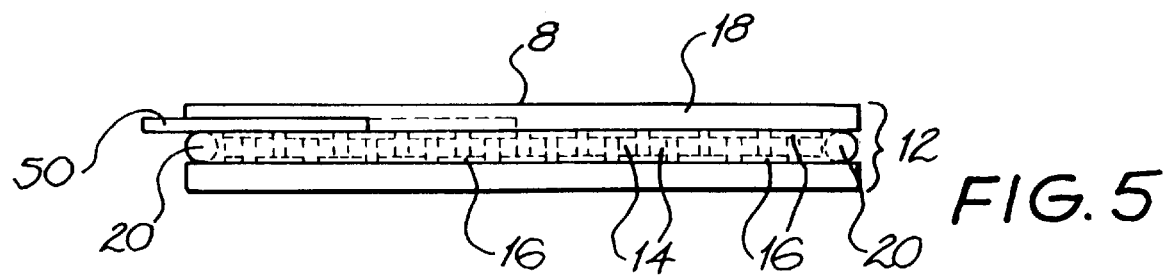
FIG. 5 is a side view looking from the direction of the arrow B in FIG. 3.

In FIGS. 3 to 5, there is shown to an enlarged scale a thermoelectric module in accordance with the present invention and as used in the thermoelectric system of FIGS. 1 and 2. In FIGS. 3 to 5, like reference numerals denote like parts as found in FIGS. 1 and 2.

With the thermoelectric module illustrated in FIGS. 3 to 5, it is necessary to connect electrical leads, positive and negative, to the array of thermocouples. This can be done using the thermoelectric module construction described in International Patent Application Nos. PCT/AU92/00008 and PCT/AU94/00039 in which electrical connections are held in a plastics material plate which creates smooth inside faces all around for O-ring sealing. Alternatively, two small slots can be formed in inside faces of the plates 18 to make the electrical leads flush with the inside faces. This is shown in FIGS. 3 to 5 in which there is shown electrical leads 50 extending into slots 52 formed on an inside face of one of the anodised aluminium plates 18. The slots 52 containing the leads 50 are sealed by any suitable means.

The use of the anodised aluminium plates 18 and the O-ring 20 provides a vacuum tight seal which increases the efficiency of the thermoelectric module 12, if evacuated by reducing conductive and convective losses between the hot and cold faces. Also, the efficiency of the thermoelectric module 12 may be increased by reducing condensation from the region of the thermocouples 14.

There may be provided a pump out port to evacuate the region between the plates 18 and the O-ring 20 so as to create a vacuum. Alternatively, instead of a vacuum, this region may be filled with fumed silica, glass microspheres or similar electrically insulating low conductivity materials or gases such as nitrogen, argon, krypton or carbon dioxide.

The anodised aluminium plates 18 can be replaced by conventional ceramic plates. Further, the thermoelectric module is in accordance with the present invention, whilst it is preferably substantially circular in plan view, may also have other shapes. For example, it may be square or rectangular in plan view.

Modifications and variations such as would be apparent by a skilled addressee are deemed within the scope of the present invention.

I claim:

1. A thermoelectric system characterised by a thermoelectric module heat pump having first and second opposed outer faces, the first outer face being relatively cool and the second outer face being relatively hot in use, a manifold defining a volume being attached to at least one outer face of the thermoelectric module, the manifold having a liquid inlet and a liquid outlet and an open face adjacent the at least one outer face of the thermoelectric module so that, in use, liquid flows through the manifold and the at least one outer face of the thermoelectric module is directly contacted by the liquid passing through the manifold, wherein the manifold contains a non-static means arranged for movement relative to the at least one outer face of the thermoelectric module for increasing turbulence in the liquid flowing through the manifold so as to increase efficiency of heat transfer between the thermoelectric module and the liquid.

2. A thermoelectric system according to claim 1, characterised in that the non-static means for increasing turbulence in the liquid is in the form of an impeller.

3. A thermoelectric system according to claim 2, characterised in that the impeller is an open-faced impeller with a number of blades extending outwardly from a hub.

4. A thermoelectric system according to claim 2, characterised in that the impeller is mounted on a driven axially rotatable shaft.

5. A thermoelectric system according to claim 1 characterised in that the thermoelectric module has electrically insulating, heat conductive plates as its outer faces.

6. A thermoelectric system according to claim 5, characterised in that the plates are formed of anodised aluminium.

7. A thermoelectric system according to claim 5, characterised in that there is a peripheral gap between the plates and this gap is sealed.

8. A thermoelectric system according to claim 7, characterised in that the gap is sealed by an O-ring seal.

9. A thermoelectric system according to any one of claims 5, characterised in that the plates are substantially circular in plan view.

10. A thermoelectric system according to any one of claims 5, characterised in that there are provided recesses in the plates, which recesses contain electrical leads for the thermoelectric module.

* * * * *